(12) United States Patent
Paik et al.

(10) Patent No.: US 7,271,852 B2
(45) Date of Patent: Sep. 18, 2007

(54) DIGITAL TELEVISION RECEIVER WITH AUTOMATIC GAIN CONTROL UNIT AND METHOD

(75) Inventors: Won-Kyu Paik, Suwon (KR); Do-Han Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 551 days.

(21) Appl. No.: 10/659,591

(22) Filed: Sep. 10, 2003

(65) Prior Publication Data

US 2004/0207761 A1 Oct. 21, 2004

(30) Foreign Application Priority Data

Apr. 17, 2003 (KR) .................. 10-2003-0024341

(51) Int. Cl.
*H04N 5/44* (2006.01)
*H04B 7/00* (2006.01)

(52) U.S. Cl. ............... 348/725; 375/345; 455/234.1; 455/239.1; 455/240.1

(58) Field of Classification Search ............... 348/678, 348/725, 726, 735; 375/345; 455/234.1, 455/234.2, 239.1, 240.1, 241.1
See application file for complete search history.

(56) References Cited

U.S. PATENT DOCUMENTS

| | | | | |
|---|---|---|---|---|
| 4,989,074 A | * | 1/1991 | Matsumoto | ............... 348/572 |
| 5,204,977 A | * | 4/1993 | Feldt | ..................... 455/234.2 |
| 6,044,253 A | * | 3/2000 | Tsumura | ................. 455/234.1 |
| 6,771,719 B1 | * | 8/2004 | Koyama et al. | ............. 375/345 |
| 6,996,386 B2 | * | 2/2006 | Yamanaka | ............... 455/234.2 |
| 7,046,976 B2 | * | 5/2006 | Le Naour et al. | ........ 455/240.1 |
| 7,076,224 B2 | * | 7/2006 | Giry-Cassan et al. | .... 455/241.1 |

* cited by examiner

*Primary Examiner*—Michael H. Lee
(74) *Attorney, Agent, or Firm*—F. Chau & Associates, LLC (57) ABSTRACT

An automatic gain controller (AGC) and method for use in a digital TV receiver having an IF amplifier, an RF amplifier, an analog to digital converter (ADC) connected to the IF amplifier, and a demodulator connected to the ADC, the AGC comprising: an input selector for selecting as feedback signal one of a digitized IF signal output of the ADC and a demodulated signal output of the demodulator; a signal detection unit for detecting the conditions of the feedback signal and outputting status signals; and a traffic controller for receiving the status signals and outputting control signals based on the status signals to an IF gain controller and an RF gain controller for independent gain control of the RF amplifier and the IF amplifier. The AGC and method further including hysteresis-curve-based switching for alternatively halting adjustments to IF gain while adjusting RF gain or halting adjustments to RF gain while adjusting IF gain.

28 Claims, 5 Drawing Sheets

DIGITAL TELEVISION RECEIVER WITH AUTOMATIC GAIN CONTROL UNIT AND METHOD

BACKGROUND OF THE INVENTION

This application claims priority to Korean Patent Application No. 2003-24341, filed on Apr. 17, 2003, in the Korean Intellectual Property Office.

1. Field of the Invention

The present invention relates to digital television (hereinafter, referred to as "DTV"), and more particularly, to an automatic gain controller (AGC) of a digital television (DTV) receiving unit.

2. Discussion of the Related Art

Digital television broadcasts produce higher definition or higher resolution television (HDTV) as compared to traditional analog TV broadcasts. The pictures reproduced from a HDTV broadcast are higher resolution and are less grainy. The images reproduced appear more livelier. DTV signal broadcast formats are defined by the Advanced Television Systems Committee (ATSC). Broadcast signals include vestigial sideband ("VSB"), e.g. 8-VSB for the United States. It is known that broadcasts of VSB signals are susceptible to multipath interference, such as interference from multiple signals arriving at an antenna at different times due to obstacles such as buildings and vehicles. For this reason, there is great interest in the development of a robust receiving unit, capable of stably receiving VSB signals under high-noise multipath channels.

A VSB data frame includes two fields. One field consists of 313 segments. A first segment of each field is a field synchronous signal. The synchronous signal includes 832 symbols. The upper four symbols of the synchronous signal is a segment synchronous signal having levels of +5, −5, −5, and +5. The field synchronous signal indicates a start point of a data field (data+FEC (forward error correction)). The field synchronous signal is used as a reference signal of a channel equalizer, and also is used as a reference signal for determining the use of a NTSC rejection filter (NRF). In addition, the field synchronous signal may be used for confirming channel characteristics, and also may be used for determining loop parameters of a phase tracker.

A field synchronous signal has sequences such as Pseudo-random Number 511 (PN511) sequence, PN63 sequence, VSB MODE, and Reserved. The PN511 sequence is a sequence of a 511-symbol length, which is used as a training sequence for a channel equalizer. The PN63 sequence is a training sequence for a channel equalizer, like the PN511 sequence. In the PN63 sequence, a symbol polarity of a middle PN63 sequence among three PN63 sequences is changed reversely per each field, in order to distinguish a first field and a second field in one frame. The VSB MODE is a sequence of a 24-symbol length, and represents a transmission mode of currently transmitted data. That is, the VSB MODE represents whether the data transmission format is a 15VSB format or a 8VSB format. The Reserved is a space of a 104-symbol length remained as a reserved space.

A conventional digital TV receiver includes an antenna for receiving through the air RF signals, RF and IF amplifiers for amplifying RF and IF signals, and a demodulator for demodulating the IF signals to recover signals representing the broadcasted images. An automatic gain controller (AGC) is used to control the gains of the RF and IF amplifiers. Conventionally, a portion or a digitized version of the IF signal is used as a feedback signal for processing by the AGC. Typically, the AGC controls both RF and IF amplifiers using a feedback loop.

Conventional single feedback loop AGCs which control RF and IF amplifiers with a single integrator have generally been implemented for both coherent and non-coherent modes of operation. The drawbacks to such scheme are twofold. First, the control over amplifiers that have different transfer function characteristics, with a common controlling arm, will result in degraded tracking response, adding to the already non-linear response inherent in practical AGC systems. Second, coherent mode depends on the demodulation processes. Demodulation blocks whose operations are limited and not stable will compromise the performance of the AGC. Other schemes involve the use of signals at the matched filter upward or the equalizer output for decision directed feedback buffer from multi-path interference discussed above, since the coherency of the reference signals cannot always be considered good references for gain control. In addition, the delayed demodulator response prohibits the use of coherent mode of operation with the already time-delayed tuner response that is non-linear.

The use of dual AGCs for RF and IF amplifier control has been proposed. Such device facilitates faster and better gain control as compared to conventional single AGC devices. However, if the RF and IF amplifiers are commonly controlled, even with dual AGCs, the non-linear error characteristics of the amplifiers may be difficult to correct, especially if fixed reference levels are used. For muti-channel processing, different fixed references must also be used.

A need therefore exists for a digital television receiving unit which is adapted to high-noise multiple path channels so as to stably acquire and track VSB signals.

SUMMARY OF THE INVENTION

According to embodiments of the present invention, there is provided a digital television receiving unit including, an RF module, an AD converter, a demodulator, a signal extractor, and an automatic gain controller. The RF module receives a wireless skywave VSB groundwave from an allocated channel, amplifies an RF signal and IF signal thereof, according to a final RF gain control signal and final IF gain control signal, and extracts and outputs a VSB analog signal from the amplified signal. The AD converter converts the VSB analog signal into a digital signal to output a VSB digital signal. The demodulator generates and outputs a demodulated signal, wherein the demodulated signal is a restored signal of the VSB digital signal, as a signal used upon transmission. The signal processing unit performs removal of a NTSC signal, distortion compensation, phase tracking, and error correction, for the demodulated signal, and decodes the result signal, and extracts and outputs a digital television display signal from the decoded signal. The automatic gain controller receives the VSB digital signal and the demodulated signal of the VSB digital signal, selects one among the VSB digital signal and the demodulated signal, corresponding to signal selection information, calculates coefficient update information which is modified according to a state of the demodulated signal, a power value of the selected signal, a level of the power value, and a temporal differential value of the power value, and generates and outputs a final IF gain control signal and a final RF gain control signal, using a three-step gear conversion scheme, according to IF hold information and RF hold information obtained using a predetermined switching scheme having a hysteresis characteristic.

According to a preferred embodiment of the invention, a digital TV receiver comprising: an automatic gain controller (AGC) for processing a feedback signal and a coefficient update signal for outputting control signals for independent gain control of an RF amplifier and an IF amplifier; an analog to digital converter (ADC) for converting analog signal output from the IF amplifier; and a demodulator for demodulating the signal output from the ADC and outputting a demodulated signal to a signal processor, wherein one of the demodulated signal and the signal output from the ADC is used as the feedback signal in the AGC.

Preferably, the digital TV receiver includes a coefficient update signal output by a coefficient updator for adaptively adjusting the coefficient update signal based on saturation characteristics of the demodulated signal. The AGC includes an IF gain controller for obtaining an error signal based on the difference between the coefficient update signal and one of the demodulated signal and the signal output from the ADC, and the IF gain controller has piece-wise linearization stages for processing the error signal to control the IF gain. Alternatively, the AGC includes an RF gain controller for obtaining an error signal based on the difference between the coefficient update signal and one of the demodulated signal and the signal output from the ADC, and the RF gain controller has piece-wise linearization stages for processing the error signal to control the RF gain, wherein the piece-wise linearization stages include: first stage for resetting the error signal to a predefined constant if a power of the feedback signal is within a high one of a high, middle and reference power level regions, and for passing-through the error signal if the power of the feedback signal is within one of the middle and reference power level regions; and a second stage for disproportionally scaling the output of the first stage based on the power level region. The piece-wise linearization stages further include a third stage for receiving signal output from the second stage and an oscillation indicator signal wherein adjustment to the output of the second stage is made based on the power level region and the oscillation indicator signal.

According to this embodiment, the AGC includes a traffic controller for halting adjustments to both of IF gain and RF gain based on a predefined noise threshold condition; for halting adjustments to both of IF gain and RF gain based on a predefined steady state threshold condition; for selectively halting adjustments to IF gain and RF gain based on a predefined saturation threshold condition; for resetting the AGC based on a predefined saturation threshold condition; and for selectively halting adjustments to IF gain and RF gain based on a predefined deviation from a standard region.

The AGC further includes a hysteresis-curve-based switching circuit for alternatively halting adjustments to IF gain while adjusting RF gain and halting adjustments to RF gain while adjusting IF gain and a recursive switching circuit for controlling IF gain and RF gain when there is a deviation in power level region or when one of the IF gain and RF gain becomes saturated.

According to an automatic gain controller (AGC) of the present invention for use in a digital TV receiver having an IF amplifier, an RF amplifier, an analog to digital converter (ADC) connected to the IF amplifier, and a demodulator connected to the ADC, the AGC comprising: a signal estimation unit for selecting as a feedback signal one of a digitized IF signal output of the ADC and a demodulated signal output of the demodulator; a signal detection unit for detecting the conditions of the feedback signal and outputting status signals; and a traffic controller for receiving the status signals and outputting control signals based on the status signals to an IF gain controller and an RF gain controller for independent gain control of the RF amplifier and the IF amplifier. The status signals represent at least one of saturation, noisy, or steady state characteristics of the feedback signal. The signal estimation unit includes a coefficient updator for adaptively adjusting a coefficient update signal based on saturation characteristics of the demodulated signal.

The IF gain controller or the RF gain controller obtains an error signal based on the difference between the coefficient update signal and one of the demodulated signal and the signal output from the ADC, and the IF or RF gain controller has piece-wise linearization stages for processing the error signal to control the IF or RF gain., wherein the piece-wise linearization stages include: first stage for resetting the error signal to a predefined constant if a power of the feedback signal is within a strong one of a strong, middle and reference power level regions, and for passing-through the error signal if the power of the feedback signal is within one of the middle and reference power level regions; and a second stage for disproportionally scaling the output of the first stage based on the power level region. The piece-wise linearization stages further include a third stage for receiving signal output from the second stage and an oscillation indicator signal wherein adjustment to the output of the second stage is made based on the power level region and the oscillation indicator signal.

A method is also provided for automatic gain controlling IF and RF amplifiers in a digital TV receiver having an analog to digital converter (ADC) connected to the IF amplifier, and a demodulator connected to the ADC, the method comprising: selecting as a feedback signal one of a digitized IF signal output of the ADC and a demodulated signal output of the demodulator; detecting the conditions of the feedback signal and outputting status signals; and receiving the status signals and outputting control signals based on the status signals to an IF gain controller and an RF gain controller for independent gain control of the RF amplifier and the IF amplifier. The status signals represent at least one of saturation, noisy, or steady state characteristics of the feedback signal.

The method according to this embodiment further includes the steps of: receiving the demodulated signal and outputting a coefficient update signal based on saturation characteristics of the demodulated signal; obtaining an error signal based on the difference between the coefficient update signal and one of the demodulated signal and the signal output from the ADC, and processing the error signal using piece-wise linearization stages to control the IF or RF gain.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

According to preferred embodiments of the present invention, a digital television receiver and method are provided for acquiring spurious signals and signal oscillations, monitoring outputs of a matched filter of a demodulator, and independently controlling IF/RF gains, using multi-step gear conversion having a hysteresis characteristic.

According to one embodiment of the invention, a signal estimation unit receives a VSB digital signal ADCS, and a demodulated signal of the VSB digital signal, selects and outputs one among the VSB digital signal and the demodulated signal, corresponding to signal selection information, measures and outputs a power value of the selected signal, and outputs coefficient update information if locking information is activated, wherein the coefficient update information is modified according to a saturation state level of the demodulated signal.

A signal state detection unit calculates signal characteristic information including a temporal differential value of the power value and determines one of a high, medium, and low level of the power value. It outputs the level information of the power value: uses noise detection information for determining the presence of a spurious signal, and steady state detection information for determining a steady state, and oscillation detection information for determining an oscillation state.

An AGC traffic control unit activates the locking information if the steady state detection information is activated, outputs a reset signal which is activated under a predetermined condition, if both an integral IF AGC signal and an integral RF AGC signal are at saturation states, and outputs IF hold information and RF hold information using a switching scheme having a hysteresis characteristic, based on at least one or more of the integral IF AGC signal, the integral RF AGC signal, the noise detection signal, the level information, the steady state detection information, and the oscillation detection information.

An IF/RF gain control unit receives the selected signal, the coefficient update information, the level information, and the oscillation detection information, and generates and outputs a final IF gain control signal and a final RF gain control signal. The gain control signals are preferably generated using a three-step gear scheme, according to the IF hold information or RF hold information which is not a hold state, wherein the final IF gain control signal is an analog signal converted from the integral IF AGC signal and the final RF gain control signal is an analog signal converted from the integral RF AGC signal.

The predetermined condition is a case that saturation states of the integral IF AGC signal and the integral RF AGC signal are detected at predetermined times or more within a constant window. The switching control with hystersis selectively inverts hold states of the IF hold information and RF hold information if any one among the integral IF AGC signal and integral RF AGC signal is a saturation state: and if the power value level is deviated from a reference level. The switching control sets both the IF hold information and RF hold information to hold states if the noise detection information is activated; if the oscillation detection information represents a great oscillation state; and if the steady state detection information is activated.

The three-step gear conversion stages change an error value (the difference between the selected signal and a reference signal) into a constant value, if the power value level of the selected signal is a high level; and performs first-step gain control which passes the error value as it is, if the power value level is a middle or reference level. It performs second-step gain control which allocates a gear corresponding to the power value level to the error value, to piecewise shift the gain value; and then performs third-step gain control which dampens the gain if the oscillation detection information is in a small oscillation state.

According to one aspect of the present invention, there is provided an automatic gain control method of a digital television receiving unit as follows. First, a VSB digital signal and a demodulated signal of the VSB digital signal are received. Then, any one among the VSB digital signal and the demodulated signal is selected, corresponding to predetermined signal selection information. A power value of the selected signal is measured and outputted. Coefficient update information is output, if locking information is activated, wherein the coefficient update information is modified according to a saturation state level of the demodulated signal. Then, a temporal differential value of the power value is calculated, a level of the power value is determined so to output level information. At the same time, noise detection information for determining the presence of a spurious signal, steady state detection information for determining a steady state, and oscillation detection information for determining an oscillation state are output. The locking information is activated if the steady state detection information is activated. If both an integral IF AGC signal and integral RF AGC signal are in saturation states, a reset signal which is activated under a predetermined condition is output. IF hold information and RF hold information are output using a switching scheme having a hysteresis characteristic, corresponding to the integral IF AGC information, the integral RF AGC information, the noise detection information, the level information, the steady state detection information, and the oscillation detection information. Thus, the selected signal, the level information of the power value, the coefficient update information, and the oscillation detection information are received, and a final IF gain control signal and final RF gain control signal are generated using a three-step gear conversion scheme, according to the IF hold information or RF hold information which is not a hold state, wherein the final IF gain control signal is an analog signal converted from the integral IF AGC signal and the final RF gain control signal is an analog signal converted from the integral RF AGC signal.

According to another aspect of an automatic gain control unit and method of the present invention, which receives a VSB digital signal (ADCS) and a demodulated signal (DCRS) of the VSB digital signal, selects one of the VSB digital signal (ADCS) and the demodulated signal (DCRS), corresponding to signal selection information (SSI), calculates a power value of the selected signal, a level of the power value, and a differential value of the power value, and generates and outputs a final IF gain control signal (IFG) and a final RF gain control signal (RFG), using a three-step gear conversion scheme, according to IF hold information (IFH) and RF hold information (RFH) obtained using a switching scheme having a hysteresis characteristic.

An automatic gain control unit according to the present invention is adapted to high-noise multipath channels so to stably acquire and track VSB signals, by acquiring spurious signals and signal oscillations, monitoring outputs of a matched filter of a demodulator, and controlling IF/RF gains using multi-step gear conversion, according to IF hold information (IFH) and RF hold information (RFH) obtained using a switching scheme having a hysteresis characteristic.

Using such control unit and method, a superior image having no or reduced distortion can be displayed.

According to a test using the present automatic gain control unit, it was seen that a dynamic area, which can acquire and process signals, is improved by about 12 dB, as compared to the conventional technique, and tracking performance is improved up to 8 dB gain fluctuation.

Figure 1:
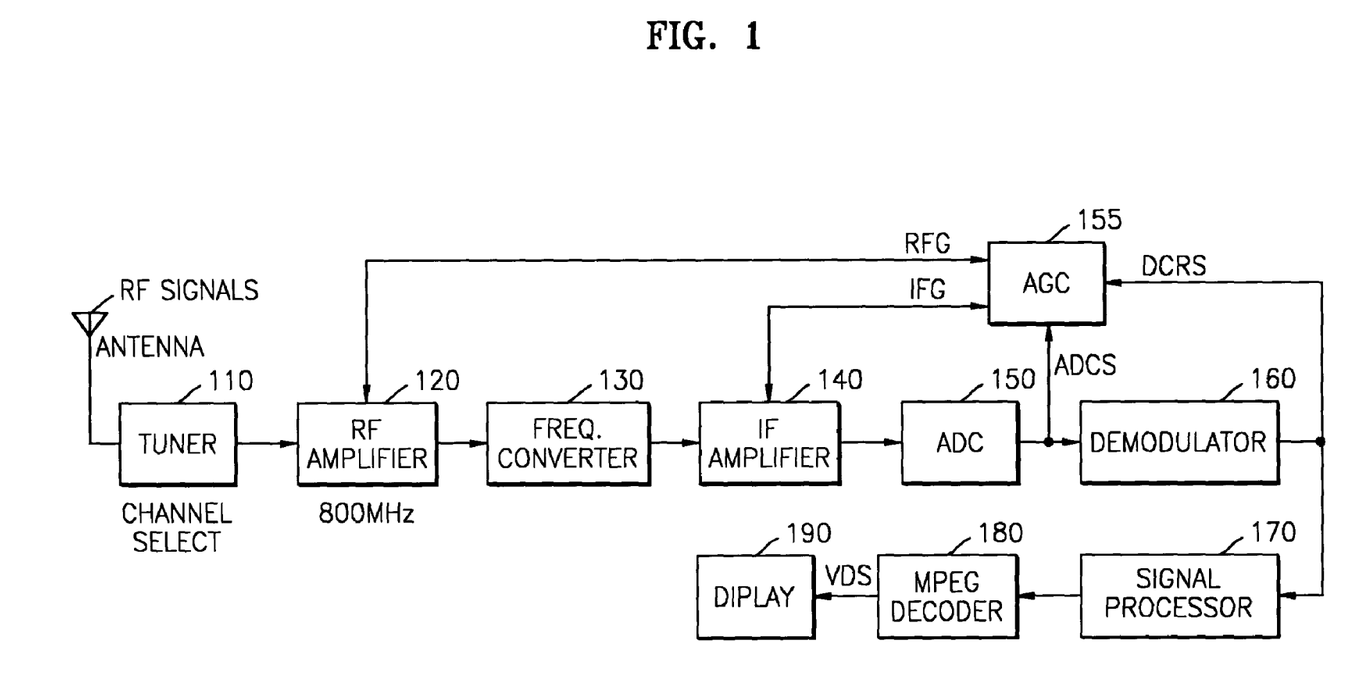
FIG. 1 is a block diagram of a digital television receiving unit according to an embodiment of the present invention.

FIG. 1 shows a digital TV receiver according to an embodiment of the present invention. The major blocks of the digital TV receiver are: an antenna for receiving through the air RF signals; a tuner 110 for channel select; an RF amplifier 120 for amplifying the RF signals of the selected channel; a frequency converter 130 for converting the selected RF signal having an intermediate frequency (IF); an IF amplifier 140 for amplifying the IF signal; an ADC 150 for converting the amplified IF signal into a digital signal; a demodulator 160 for demodulating the signals upward from ADC 150; an automatic gain controller (AGC) 155 for adaptively and independently controlling the RF amplifier 120 and IF amplifier 140; signal processing circuitry 170 for processing the signals demodulated by the demodulator 160; MPEG decoder 180 for decoding MPEG signals output from signal processor 170; and a display 190 for displaying the television signals.

The demodulator 160 generates and outputs a demodulated signal (DCRS), which is a restored or demodulated signal of the VSB digital signal (ADCS). The demodulated signal (DCRS) is a signal which is created by removing direct current (DC) component from an output signal of a matched filter (not shown) within the demodulator.

The signal processing unit 170 receives the demodulated signal (DCRS) and performs removal of an NTSC signal, distortion compensation, phase tracking, and error correction. MPEG decoder 180 decodes the result signal, and extracts and outputs a display signal (VDS). As known by those of ordinary skill in the art, the functions of the signal processing unit 170 can be performed by known circuits such as an NTSC rejection filter to remove an NTSC signal from the demodulated signal (DCRS), an equalizer to compensate signal distortion, a phase tracking loop to track phases, and a decoder (forward error correction unit) to perform error correction and decoding to output the display signal (VDS).

Such a display signal (VDS) is supplied to a display 190 such as a liquid crystal display (LCD) panel or a cathode ray tube (CRT), through a video board for processing a display signal (VDS), and an image provided by the display signal (VDS) is displayed on display 190.

The automatic gain controller 155 receives the VSB digital signal (ADCS) and the demodulated signal (DCRS) of the VSB digital signal, selects one among the VSB signal (ADCS) and the demodulated signal (DCRS), corresponding to signal selection information (SSI), and generates and outputs a final IF gain control signal (IFG) and final RF gain control signal (RFG). Preferably, a three-step gear conversion scheme having hysteresis characteristics is employed, to be further discussed below.

Figure 2:
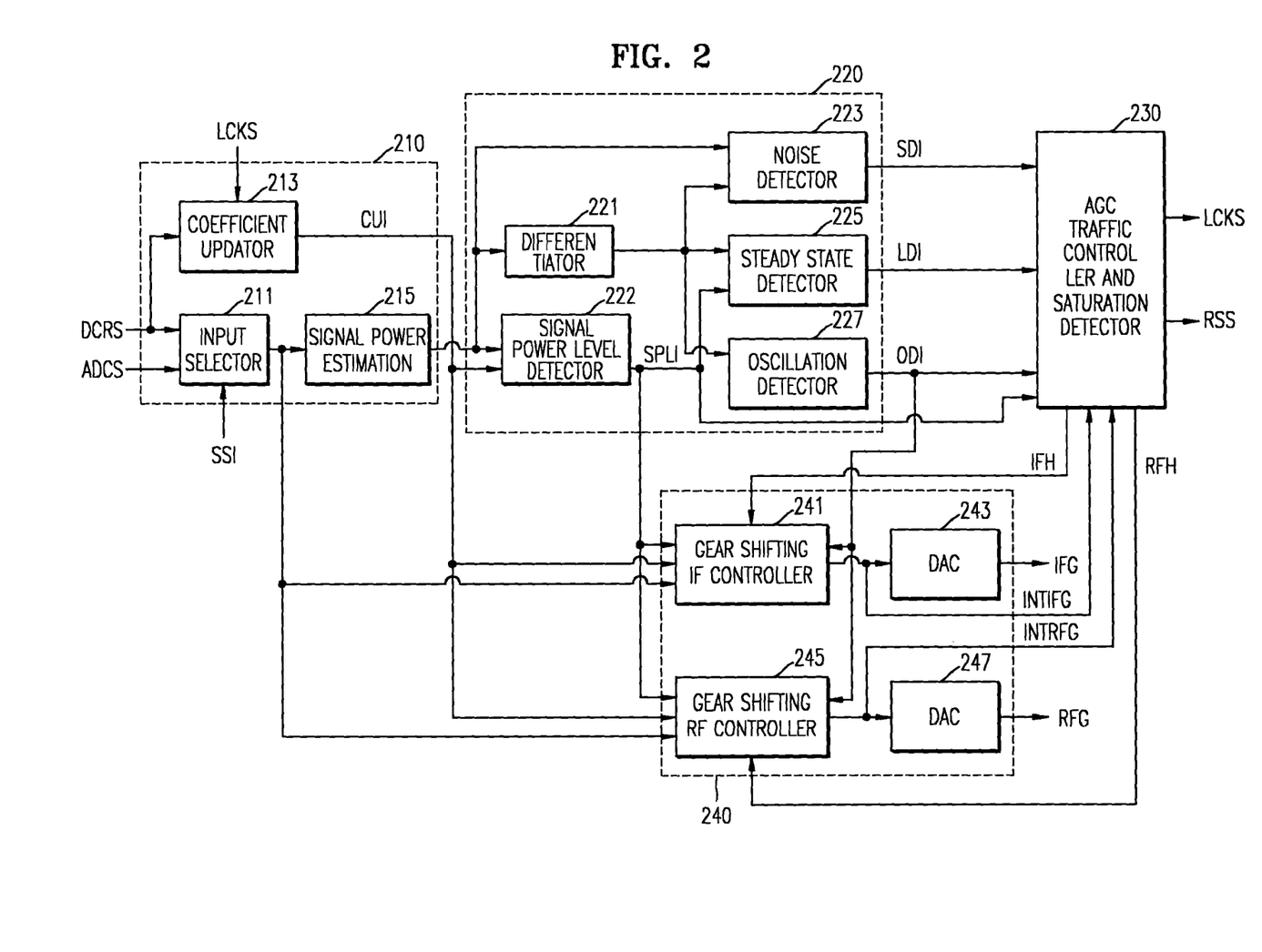
FIG. 2 is a detailed block diagram of the AGC of FIG. 1.

FIG. 2 is a block diagram showing a detailed construction of the automatic gain controller of FIG. 1.

Referring to FIG. 2, the automatic gain controller (155 of FIG. 1) includes a signal estimation unit 210, a signal state detection unit 220, an AGC traffic control and saturation detection unit 230, and an IF/RF gain controller (240).

The signal estimation unit 210 receives the VSB digital signal (ADCS) and the demodulated signal (DCRS). One of the two signals is selected based on the signal selection information (SSI) at input selector 211. The signal estimation unit 210 measures and outputs the power value of the selected signal, and outputs coefficient update information (CUI). The CUI is updated by coefficient updater 213, which calculates degree of saturation from the demodulated signal (DCRS). CUI is used as a reference value on the Gear Shifting IF/RF controllers (241, 245) and on signal power level detector 222. The measured power value is an average value of the selected signal within a predetermined window. The signal selection information (SSI) is an external signal.

The signal state detection unit 220 determines the signal conditions such as the level of noise, steady state or oscillation. It receives the (CUI) and the (SPE) output from the signal power estimator 215; calculates a temporal differential in power and outputs a signal power level information (SPLI); determines the presence of a spurious signal and outputs noise detection information (SDI); determines a steady state condition and outputs steady state detection information (LDI); detects the presence of an oscillation and outputs oscillation detection information (ODI). The temporal differential of the power value is the difference between a power value average within a previous window and a power value average within a current window, when the power value of a stream format are divided by a predetermined window (that is, predetermined time or predetermined number of symbols).

The signal state detection unit 220 includes a differentiator unit 221, a signal power level detector 222, a noise detector 223, a steady state detector 225, and an oscillation detector 227. The differentiator 221 receives a power value from signal power estimator 215 and calculates and outputs a temporal differential power value. The signal power level detector 222 receives the (CUI) signal and the power (SPE) value output from signal power estimator 215, and outputs level information (SPLI) of the power value. The power output level is graded as standard C, medium B, and high A. The noise detector 223 compares the power value (SPE) with the differential value from differentiator 421 to determine the presence of a spurious signal and generate and output noise detection information (SDI). The steady state detector 225 determines a steady state condition from the differentiated value and the level information (SPLI) and generates and outputs steady state detection information (LDI). The steady state is a state that the level of the power value is a standard level C and no noise exists. The oscillation detector 227 determines whether there is a large oscillation or a small oscillation from the differentiated value and generates and outputs oscillation detection information (ODI).

The IF/RF gain controller 240 includes a gear shifting IF controller 241, a first DA conversion unit 243, a gear shifting RF controller 245, and a second DA conversion unit 247. The IF controller 241 receives the signal selected by (SSI), the level information (SPLI), the coefficient update information (CUI), IF hold information (IFH), and the oscillation detection information (ODI). The IF/RF gain controller 240 generates and outputs an integral IF AGC signal (INTIFG), preferably by using a three-step gear conversion scheme, if the IF hold information (IFH) is at an active state and the RF hold information (RFH) is at a hold state. The first DA conversion unit 243 outputs a final IF gain control signal (IFG), which is an analog signal converted from the integral IF AGC signal (INTIFG).

The RF controller 245 receives the signal selected by (SSI), the level information (SPLI), the coefficient update information (CUI), the RF hold information (RFH), and the oscillation detection information (ODI), and generates and outputs an integral RF AGC signal (INTRFG), preferably by a three-step gear conversion scheme, if the RF hold information (RFH) is at an active state and the IF hold information (IFH) is at a hold state. The second DA conversion unit 547 outputs a final RF gain control signal RFG, which is an analog signal converted from the integral RF AGC signal (INTRFG).

The AGC traffic controller 230 is a control module, preferably a stored program which when executed, coordinates and controls the functions of the IF controller 241 and RF controller 245. The AGC traffic controller 230 receives the integral IF AGC signal (INTIFG), the integral RF AGC signal (INTRFG), the noise detection signal (SDI), the level information (SPLI), the steady state detection information (LDI), and the oscillation detection information (ODI).

Figure 3:
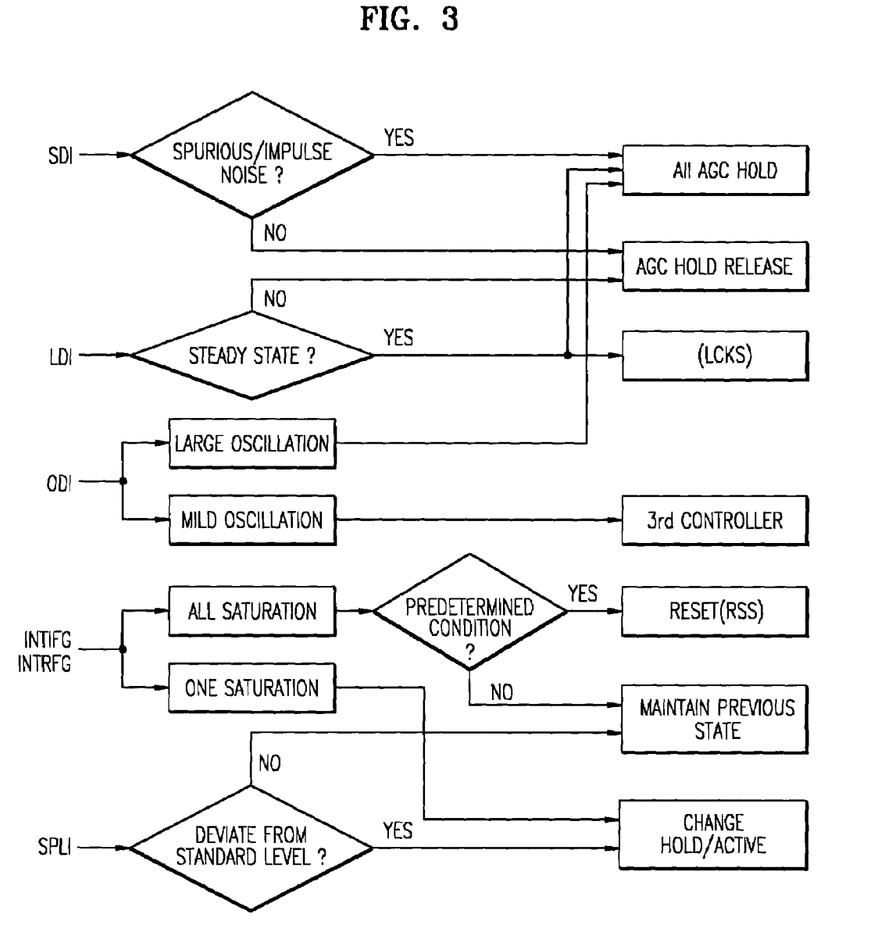
FIG. 3 is a flow diagram illustrating control flow of the AGC.

FIG. 3 is a flow diagram illustrating exemplary functions performed by AGC traffic controller 230. The AGC traffic controller 230 outputs locking information (LCKS) if the steady state detection information (LDI) indicates a steady state condition. An active (LCKS) signal enables signal estimation unit 210 (FIG. 2). The AGC traffic controller outputs a reset signal (RSS) if a predetermined condition is met, such as if both an integral IF AGC signal (INTIFG) and an integral RF AGC signal (INTRFG) are in saturation states. The RSS signal activates to reset the entire receiver, as if when power is initially applied. The AGC traffic controller outputs IF hold information (IFH) and RF hold information (RFH) by a switching scheme having a hysteresis characteristic. The predetermined condition may be satisfied if saturation states of the integral IF. AGC signal (INTIFG) and the integral RF AGC (INTRFG) are detected predetermined times or more, within a constant window. The predetermined condition representing the detection times of the saturation states of the integral IF AGC signal (INTIFG) and integral RF AGC signal (INTRFG) is preferably set depending on system performance.

Referring to FIG. 2, The IF/RF gain controller 240 receives either the selected (DCRS) or (ADCS) signal selected by (SSI), the coefficient update information, the level information (SPLI) of the power value, the oscillation detection information (ODI), and generates and outputs a final IF gain control signal (IFG) for controlling the IF amplifier 140 (FIG. 1) and a final RF gain control signal (RFG) for controlling the RF amplifier 120, using a three-step gear conversion scheme, if either the IF hold information (IFH) or RF hold information (RFH) is not at a hold state. The final IF gain control signal (IFG) is preferably an analog signal converted from the integral IF AGC signal (INTIFG) and the final RF gain control signal (RFG) is preferably an analog signal converted from the integral RF AGC signal (INTRFG).

Referring again to FIG. 3, the predetermined switching scheme inverts the hold states of the IF hold information and RF hold information, if either the integral IF AGC signal (INTIFG) or the integral RF AGC signal (INTRFG) is in a saturation state, or if the level of the power value of (SPLI) is deviated from the standard level. Both the IF hold information and RF hold information are set to hold states if the noise detection information (SDI) signals spurious noise level, and if the oscillation detection information (ODI) signals a large oscillation state, and if the steady state detection information (LDI) signals a steady state condition. In such instance, both IF controller 241 and RF controller 245 are held.

Figure 4:
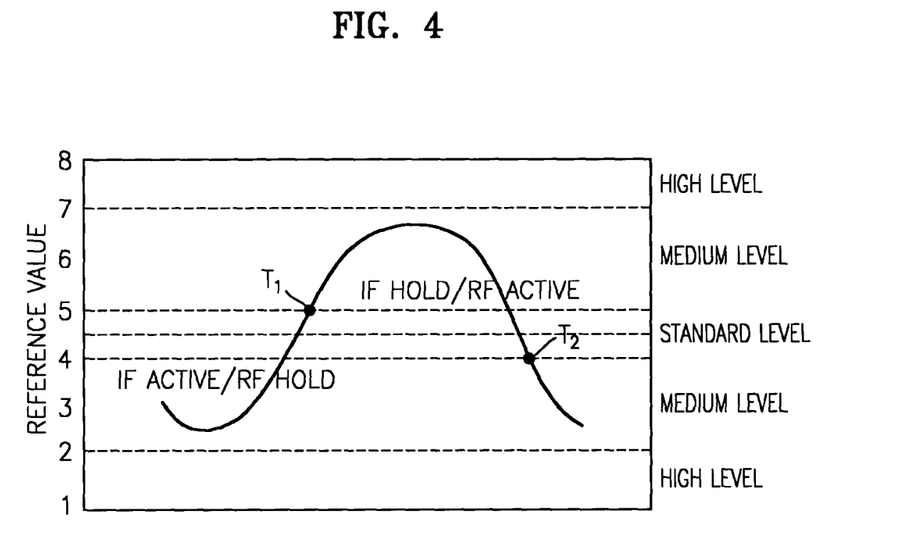
FIG. 4 shows a RF/IF switching curve having hysteresis characteristics.

Such a switching scheme has a hysteresis characteristic if one of the IF hold information (IFH) and the RF hold information (RFH) is active, as shown in FIG. 4. Referring to FIG. 4, as an illustration, if a power level of a received signal is presently at medium B level and RF is at a hold state, at a time T1, and the signal power level is changed from a standard C level to an upper medium B level, then IF goes to a hold state and RF is operated. Thereafter, at a time T2, when the signal power level is lowered from the medium B level to the standard C level and then proceeds to a lower medium B level, the RF is changed from an active to a hold state.

Figure 5:
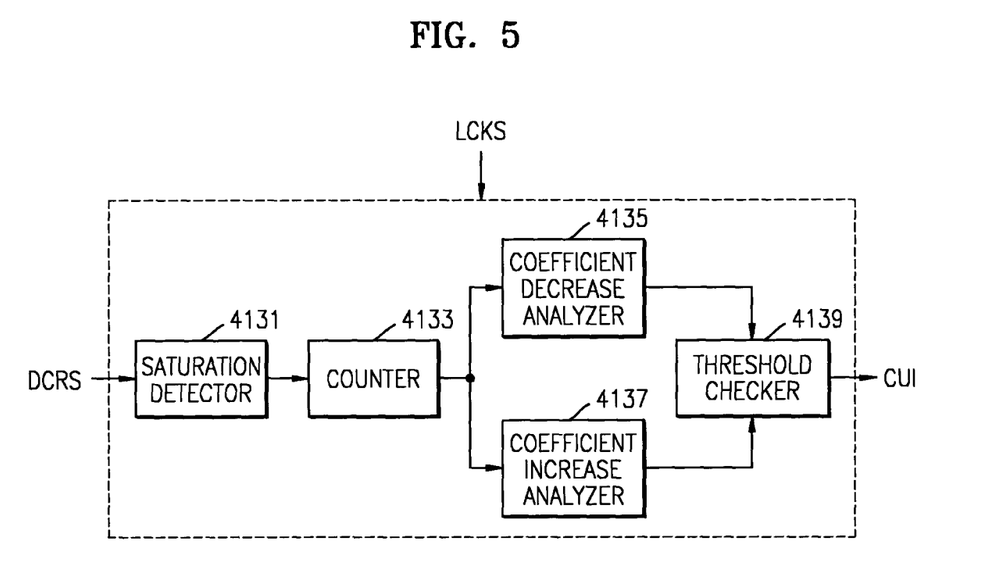
FIG. 5 is a block diagram of a coefficient update unit of FIG. 2.

FIG. 5 is a block diagram of the coefficient updater unit 213 of FIG. 2.

Referring to FIG. 5, the coefficient updater 213 includes a saturation detector 4131, a counter 4133, a coefficient decrease analyzer 4135, a coefficient increase analyzer 4137, and a threshold value checker 4139. The saturation detector 4131, the counter 4133, the coefficient decrease analyzer 4135, the coefficient increase analyzer 4137, the threshold value checker 4139 are operated if the locking information (LCKS) is activated.

The saturation detector 4131 receives the demodulated signal (DCRS), compares the demodulated signal with a saturation threshold value, and outputs saturation state information which is activated if the demodulated signal (DCRS) is greater than the saturation threshold value. The saturation threshold value is user preset.

The counter 4133 sums the activated saturation state information to output counting information. The coefficient decrease analyzer 4135 outputs coefficient decrease information, if the counting information is greater than a larger threshold value. The coefficient increase analyzer 4137 outputs coefficient increase information, if the counting information is smaller than a smaller threshold value. The larger threshold value and the smaller threshold value are values set adaptively to system specification.

The threshold value checker 4139 generates and outputs coefficient update information (CUI) within a predetermined threshold value, according to the coefficient decrease information or the coefficient increase information, wherein the coefficient update information modifies the reference value of the power value. The predetermined threshold value is a value set so that the power value does not exceed any threshold value.

Figure 6:
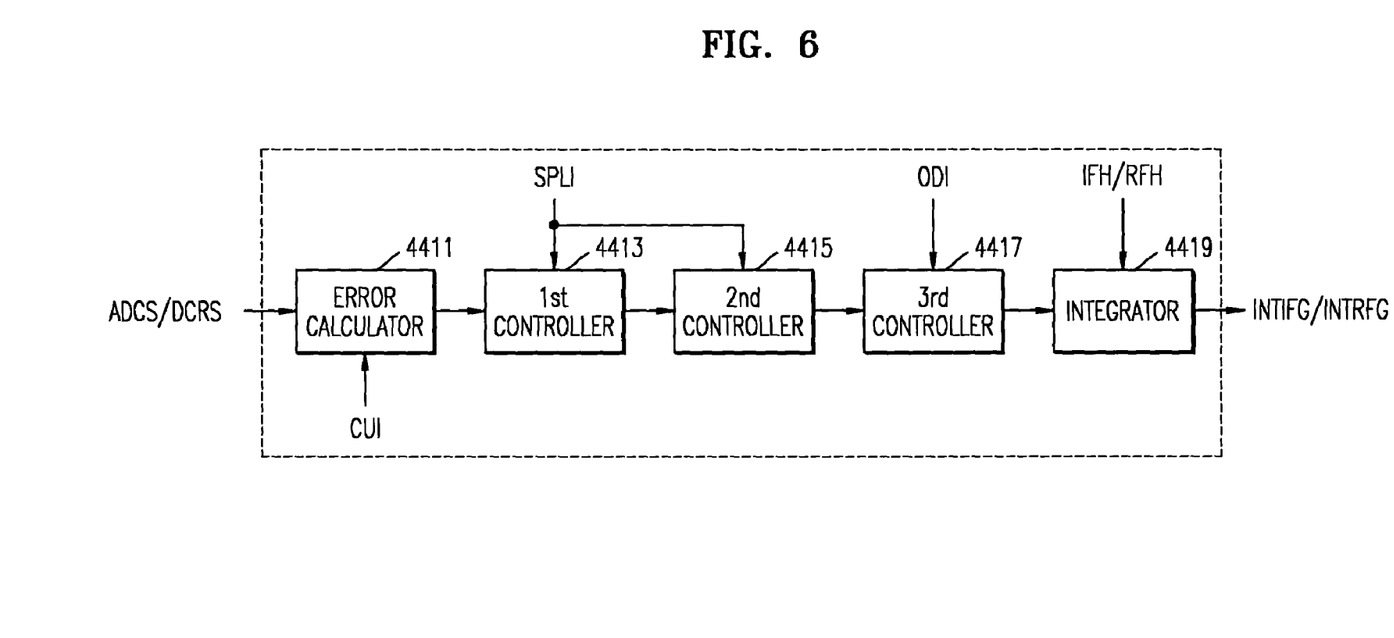
FIG. 6 is a block diagram of a gear conversion gain controller of FIG. 2.

FIG. 6 is a block diagram of the gear shifting IF and RF controllers of FIG. 2.

Referring to FIG. 6, each of the Gear Shifting IF or RF controllers 241 and 245 (shown in FIG. 2), performs the above-described three-step gear conversion scheme, and includes an error calculator 4411, a first controller 4413, a second controller 4415, a third controller 4417, and an integrator 4419.

In each of the IF controller 241 and RF controller 245, the error calculator 4411 receives the selected signal (ADCS) or (DCRS), and calculates and outputs an error value which is a difference between the selected signal and the coefficient update information (CUI). The coefficient update information (CUI) is a reference signal based on a signal transmitted without any error. The coefficient update information (CUI) is initially set as a constant value.

The first controller 4413 changes the error value into a constant value, if the power value level of the selected signal is at the high level A. The first controller 4413 performs first-step gain control which passes the error value as it is, to thereby output a first gain signal, if the power value level is a middle level or a reference level. The second controller 4415 receives the first gain signal, and performs second-step gain control which allocates a gear corresponding to the level information (SPLI) to the error value, to thereby output a second gain signal. At this time, if the power value level is the high level, a gear having a large value is allocated to make a large gain conversion. If the power value level is a reference or standard level, a gear having a small value is allocated to make a small gain conversion. Thus, the second controller acts to bring the gain signal back to standard level by piecemeal linear scaling. The third controller 4417 receives the second gain signal from the second controller 4415, and performs third-step gain control which makes a small gain conversion, corresponding to the oscillation detection information of a small oscillation state, to thereby output a third gain signal. If oscillation is small, the third controller acts to dampen the oscillation. The integrator 4419 receives the third gain signal, and integrates and outputs the integrated third gain signal.

For illustration, the three-step gear shifting scheme functions are further explained herein: The error value is calculated by error calculator 4411 by taking the difference between the selected signal (ADCS or DCRS) and the coefficient update information (CUI/reference value). This error value is first fed into the first controller (gear shifting stage) 4413 along with the power level region definition (A or B or C) information (SPIE). If the power level region is high in level A, a new error value is generated by appending the signed bit of the current error value to a predefined constant magnitude. If the power level region is not A, e.g. medium B or standard C level, then the error value is just simply the current error value or is passed-through.

This error value is passed to the input to $2^{nd}$ controller (stage gear shifting) 4415. Here the input error value is scaled with a constant gear value. The gear value assigned is dependent upon the power level region definition (A, B, or C) information (SPIE). Piecemeal linear scaling is applied with preferably three scaling (gear) values. The weighted error value is now passed on to the $3^{rd}$ stage.

In the $3^{rd}$ controller (stage gear shifting) 4417, the ODI information (mild oscillation detection) is analyzed to see if the inputted error value needs further scaling. If the ODI information is detected as active high, signaling small oscillation, the error value is once again gear-shifted down. Else if the ODI information is active at low, the error value is finally passed to the integrator 4419.

The integrator sums all the previous error values and the current error value, and outputs the (INTIFG) and (IN-TRFG) signals to the DAC (443 and 447 of FIG. 2). Preferably, the DAC is a sigma-delta type.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. An automatic gain controller (AGC) for use in a digital TV receiver having an IF amplifier, an RF amplifier, an analog to digital converter (ADC) connected to the IF amplifier, and a demodulator connected to the ADC, the AGC comprising:
    a signal estimation unit for selecting as a feedback signal one of a digitized IF signal output of the ADC and a demodulated signal output of the demodulator;
    a signal detection unit for detecting the conditions of the feedback signal and outputting status signals; and
    a traffic controller for receiving the status signals and outputting control signals based on the status signals to an IF gain controller and an RF gain controller for independent gain control of the RF amplifier and the IF amplifier.

2. The AGC according to claim 1, wherein the status signals represent at least one of saturation, noisy, or steady state characteristics of the feedback signal.

3. The AGC according to claim 1, wherein the signal estimation unit includes a coefficient updator for adaptively adjusting a coefficient update signal based on saturation characteristics of the demodulated signal.

4. The AGC according to claim 3, wherein the IF gain controller obtains an error signal based on the difference between the coefficient update signal and one of the demodulated signal and the signal output from the ADC, and the IF gain controller has piece-wise linearization stages for processing the error signal to control the IF gain.

5. The AGC according to claim 3, wherein the RF gain controller obtains an error signal based on the difference between the coefficient update signal and one of the demodulated signal and the signal output from the ADC, and the RF gain controller has piece-wise linearization stages for processing the error signal to control the RF gain.

6. The AGC according to claims 4 or 5, wherein the piece-wise linearization stages include: first stage for resetting the error signal to a predefined constant if a power of the feedback signal is within a high one of a high, middle and reference power level regions, and for passing-through the error signal if the power of the feedback signal is within one of the middle and reference power level regions; and a second stage for disproportionally scaling the output of the first stage based on the power level region.

7. The AGC according to claim 6, wherein the piece-wise linearization stages further include a third stage for receiving signal output from the second stage and an oscillation indicator signal wherein adjustment to the output of the second stage is made based on the power level region and the oscillation indicator signal.

8. The AGC according to claim 1, wherein the traffic controller halts both of the IF gain controller and the RF gain controller based on a predefined noise threshold condition.

9. The AGC according to claim 1, wherein the traffic controller halts both of the IF gain controller and the RF gain controller based on a predefined steady state threshold condition.

10. The AGC according to claim 1, wherein the traffic controller selectively halts the IF gain controller and the RF gain controller based on a predefined saturation threshold condition.

11. The AGC according to claim 1, wherein the traffic controller resets the AGC based on a predefined saturation threshold condition.

12. The AGC according to claim 1, wherein the traffic controller selectively halts the IF gain controller and the RF gain controller based on a predefined deviation from a standard region.

13. The AGC according to claim 1, wherein the traffic controller includes a hysteresis-curve-based switching circuit for alternatively halting the IF gain controller while adjusting the RF gain controller or halting the RF gain controller while adjusting the IF gain controller.

14. The AGC according to claim 1, wherein the traffic controller includes a recursive switching circuit for switching gain control between IF and RF amplifiers when there is a deviation in power level region or when one of the IF gain controller and the RF gain controller becomes saturated.

15. A method of automatic gain controlling IF and RF amplifiers in a digital TV receiver having an analog to digital converter (ADC) connected to the IF amplifier, and a demodulator connected to the ADC, the method comprising:

selecting as a feedback signal one of a digitized IF signal output of the ADC and a demodulated signal output of the demodulator;

detecting the conditions of the feedback signal and outputting status signals; and receiving the status signals and outputting control signals based on the status signals to an IF gain controller and an RF gain controller for independent gain control of the RF amplifier and the IF amplifier.

16. The method according to claim 15, wherein the status signals represent at least one of saturation, noisy, or steady state characteristics of the feedback signal.

17. The method according to claim 15, further including the steps of: receiving the demodulated signal and outputting a coefficient update signal based on saturation characteristics of the demodulated signal.

18. The method according to claim 17, further including the steps of: obtaining an error signal based on the difference between the coefficient update signal and one of the demodulated signal and the signal output from the ADC, and processing the error signal using piece-wise linearization stages to control the IF gain.

19. The method according to claim 17, further including the steps of: obtaining an error signal based on the difference between the coefficient update signal and one of the demodulated signal and the signal output from the ADC, and processing the error signal using piece-wise linearization stages to control the RF gain.

20. The method according to claims 18 or 19, wherein the piece-wise linearization stages include: first stage for resetting the error signal to a predefined constant if a power of the feedback signal is within a high one of a high, middle and reference power level regions, and for passing-through the error signal if the power of the feedback signal is within one of the middle and reference power level regions; and a second stage for disproportionally scaling the output of the first stage based on the power level region.

21. The method according to claim 20, wherein the piece-wise linearization stages further include a third stage for receiving signal output from the second stage and an oscillation indicator signal wherein adjustment to the output of the second stage is made based on the power level region and the oscillation indicator signal.

22. The Method according to claim 15, further including the step of halting both of the IF gain controller and the RF gain controller based on a predefined noise threshold condition.

23. The method according to claim 15, further including the step of halting both of the IF gain controller and the RF gain controller based on a predefined steady state threshold condition.

24. The method according to claim 15, further including the step of selectively halting the IF gain controller and the RF gain controller based on a predefined saturation threshold condition.

25. The method according to claim 15, further including the step of resetting the AGC based on a predefined saturation threshold condition.

26. The method according to claim 15, further including the step of selectively halting the IF gain controller and the RF gain controller based on a predefined deviation from a standard region.

27. The method according to claim 15, further including the step of hysteresis-curve-based switching by alternatively halting the IF gain controller while adjusting the RF gain controller or halting the RF gain controller while adjusting the IF gain controller.

28. The method according to claim 15, further including for recursively switching gain control between IF and RF amplifiers when there is a deviation in power level region or when one of the IF gain controller and the RF gain controller becomes saturated.

\* \* \* \* \*